(12) United States Patent
Chen et al.

(10) Patent No.: US 12,101,914 B2
(45) Date of Patent: Sep. 24, 2024

(54) COOLANT DISTRIBUTION UNIT

(71) Applicant: Auras Technology Co., Ltd., New Taipei (TW)

(72) Inventors: Chien-Yu Chen, New Taipei (TW); Tian-Li Ye, New Taipei (TW); Chun-Ming Hu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 32 days.

(21) Appl. No.: 17/578,796

(22) Filed: Jan. 19, 2022

(65) Prior Publication Data

US 2022/0248570 A1 Aug. 4, 2022

Related U.S. Application Data

(60) Provisional application No. 63/145,685, filed on Feb. 4, 2021.

(51) Int. Cl.
*H05K 7/20* (2006.01)

(52) U.S. Cl.
CPC ..... *H05K 7/20781* (2013.01); *H05K 7/20272* (2013.01); *H05K 7/20281* (2013.01)

(58) Field of Classification Search
None
See application file for complete search history.

(56) References Cited

U.S. PATENT DOCUMENTS

| | | | |
|---|---|---|---|
| 7,484,552 B2* | 2/2009 | Pfahnl | F28D 1/0535 |
| | | | 165/80.4 |
| 9,215,832 B2* | 12/2015 | Chang | H05K 7/20636 |
| 9,854,714 B2* | 12/2017 | Shedd | H05K 7/20809 |
| 10,609,839 B1* | 3/2020 | Archer | H05K 7/20236 |
| 11,576,283 B2* | 2/2023 | Chen | H05K 7/20627 |
| 2019/0178592 A1* | 6/2019 | Chen | H05K 7/20781 |
| 2021/0274681 A1* | 9/2021 | Holland | H05K 7/20281 |
| 2021/0352830 A1* | 11/2021 | Varela Benitez | F04B 19/00 |

* cited by examiner

*Primary Examiner* — Courtney L Smith
(74) *Attorney, Agent, or Firm* — MUNCY, GEISSLER, OLDS & LOWE, PC (57) ABSTRACT

A coolant distribution unit includes a casing, a control module, a power supply module, a heat exchange module, an integrated pipe, and a fluid driving module. The power supply module is electrically connected to the control module, the integrated pipe includes a plurality of inlets and an outlet to collect and output a cooled working fluid, the fluid driving module is electrically connected to the control module and the power supply module, and the fluid driving module is in fluid communication with the heat exchange module. The control module, power supply module, heat exchange module, integrated pipe, and fluid driving module are all arranged in the casing.

9 Claims, 7 Drawing Sheets

COOLANT DISTRIBUTION UNIT

RELATED APPLICATIONS

This application claims priority to U.S. Provisional Application Ser. No. 63/145,685, filed Feb. 4, 2021, the disclosures of which are incorporated herein by reference in their entireties.

TECHNICAL FIELD

The present disclosure generally relates to a coolant distribution unit. More particularly, the present disclosure relates to a coolant distribution unit with an integrated pipe.

BACKGROUND

A rack coolant distribution unit (Rack CDU) is a water-cooled device used in the server device. The rack coolant distribution unit can directly deliver coolant through multiple pipelines to a server rack to cool the electronic components, such as central processing units or any other electronic components, in the server rack. The rack coolant distribution unit can continuously deliver the coolant to the server rack and take away the heat inside the server rack through relevant pumps, a closed circulation pipeline and a back-end heat exchanger.

However, due to the rapid changes in technology, the racks used to store the server device are designed with various specifications in order to meet various requirements. The heat dissipation requirements of the various server racks are not the same. Therefore, the conventional rack coolant distribution unit cannot satisfy with all of sudden abnormal overheating problems of various server racks or server devices to control the working fluid thereof so as to lead to insufficient heat dissipation for certain server racks or certain unexpected abnormal situations. Therefore, there is a need to solve the above-mentioned problems.

SUMMARY

One objective of the embodiments of the present invention is to provide a coolant distribution unit able to effectively collect the working fluid so as to improve the working efficiency and the cooling capacity of the coolant distribution unit.

To achieve these and other advantages and in accordance with the objective of the embodiments of the present invention, as the embodiment broadly describes herein, the embodiments of the present invention provides a coolant distribution unit including a casing, a control module, a power supply module, a heat exchange module, an integrated pipe and a fluid driving module. The power supply module is electrically connected to the control module, the integrated pipe has a plurality of inlets and an outlet to collect a cooled working fluid and output the cooled working fluid through the outlet, and the fluid driving module is electrically connected to the control module and the power supply module, and the fluid driving module is communicated with the heat exchange module. In addition, the control module, the power supply module, the heat exchange module, the integrated pipe, and the fluid driving module are arranged in the casing.

In some embodiments, the power supply module comprises a plurality of pumps to respectively connect to the inlets of the integrated pipe.

In some embodiments, the coolant distribution unit further comprises a first liquid inlet, a second liquid inlet, a first liquid outlet and a second liquid outlet. In addition, a path from the first liquid inlet to the first liquid outlet is an external circulation path to connect a cooling device, and a path from the second liquid inlet to the second liquid outlet is an internal circulation path to connect a plurality of cold plates of a server device.

In some embodiments, the outlet of the integrated pipe connects to the second liquid outlet to collect and output the cooled working fluid to the cold plates of the server device.

In some embodiments, the coolant distribution unit further comprises a coolant replacement module, and the coolant replacement module comprises a coolant replacement inlet and a coolant replacement outlet both disposed on a front panel of the coolant distribution unit.

In some embodiments, the coolant replacement inlet is in fluid communication with a liquid storage unit of the heat exchange module to add a new working fluid and the coolant replacement outlet is in fluid communication with the second liquid inlet to exhaust a high temperature working fluid.

In some embodiments, the coolant replacement module further comprises a coolant discharge port and a coolant discharge pipe. The coolant discharge port is disposed on a rear panel of the coolant distribution unit and the coolant discharge pipe is connected between the coolant discharge port and the integrated pipe.

In some embodiments, the coolant discharge pipe is connected to the lowest point of the working fluid in the integrated pipe.

In some embodiments, the coolant distribution unit further comprises an emergency switch disposed on the front panel of the coolant distribution unit.

In some embodiments, the coolant distribution unit further comprises a display module disposed on the front panel of the coolant distribution unit.

In some embodiments, the coolant distribution unit further comprises a sensing module and a flow regulating module, and the control module further comprises a main control unit and an extension control unit electrically connected to the main control unit. The sensing module detects the sensing data of the working fluid in the pipeline channels of the first liquid inlet, the second liquid inlet, the first liquid outlet and the second liquid outlet, and the flow regulating module controls flow rates of the working fluid flowing in the pipeline channels. The main control unit of the control module electrically connects to the sensing module and the flow regulating module, and the main control unit electrically communicates with an external monitoring center through the extension control unit to send the sensing data to the external monitoring center through the extension control unit.

In some embodiments, the control module reads real-time temperature data of the server device stored in a cloud control center through a network switch, and the main control unit of the control module determines whether the server device is overheated according to the real-time temperature data of the server device and controls the fluid driving module to adjust operation performances of the pumps of the fluid driving module.

Hence, the coolant distribution unit can effectively integrate the working liquid output by a plurality of pumps so as to increase the flow rate of the working liquid and improve the cooling capacity of the coolant distribution unit. In addition, the working fluid can be replaced with no downtime so as to maintain the quality of the working fluid and improve the working quality of the coolant distribution unit.

Furthermore, the coolant distribution unit disclosed in the present invention is further equipped with an emergency switch to prevent the system from being unable to turn on or off when the network communication fails so as to further improve the stability and safety of the coolant distribution unit in use.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
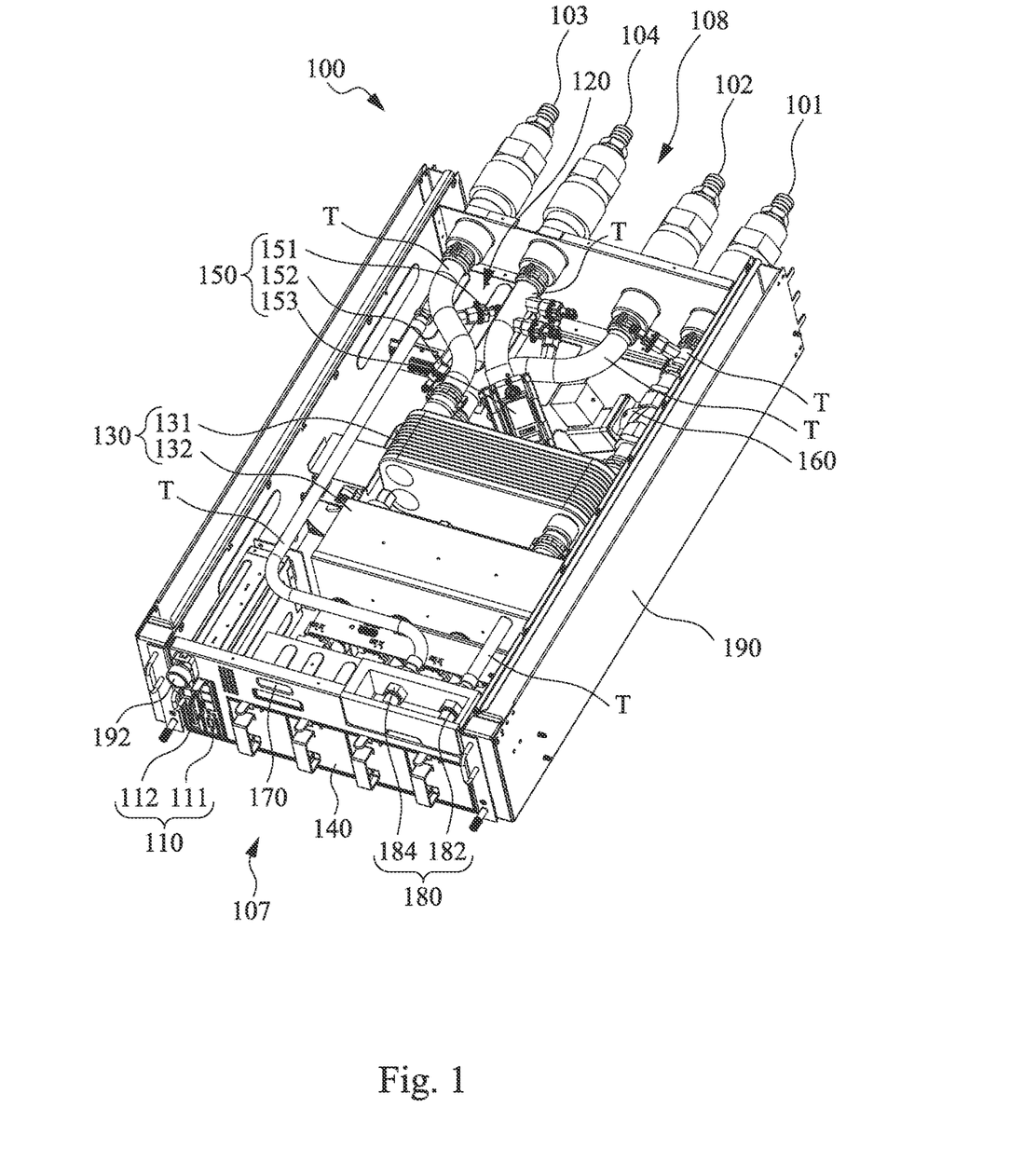
FIG. 1 illustrates a schematic perspective diagram showing a coolant distribution unit according to one embodiment of the present invention.
Figure 2:
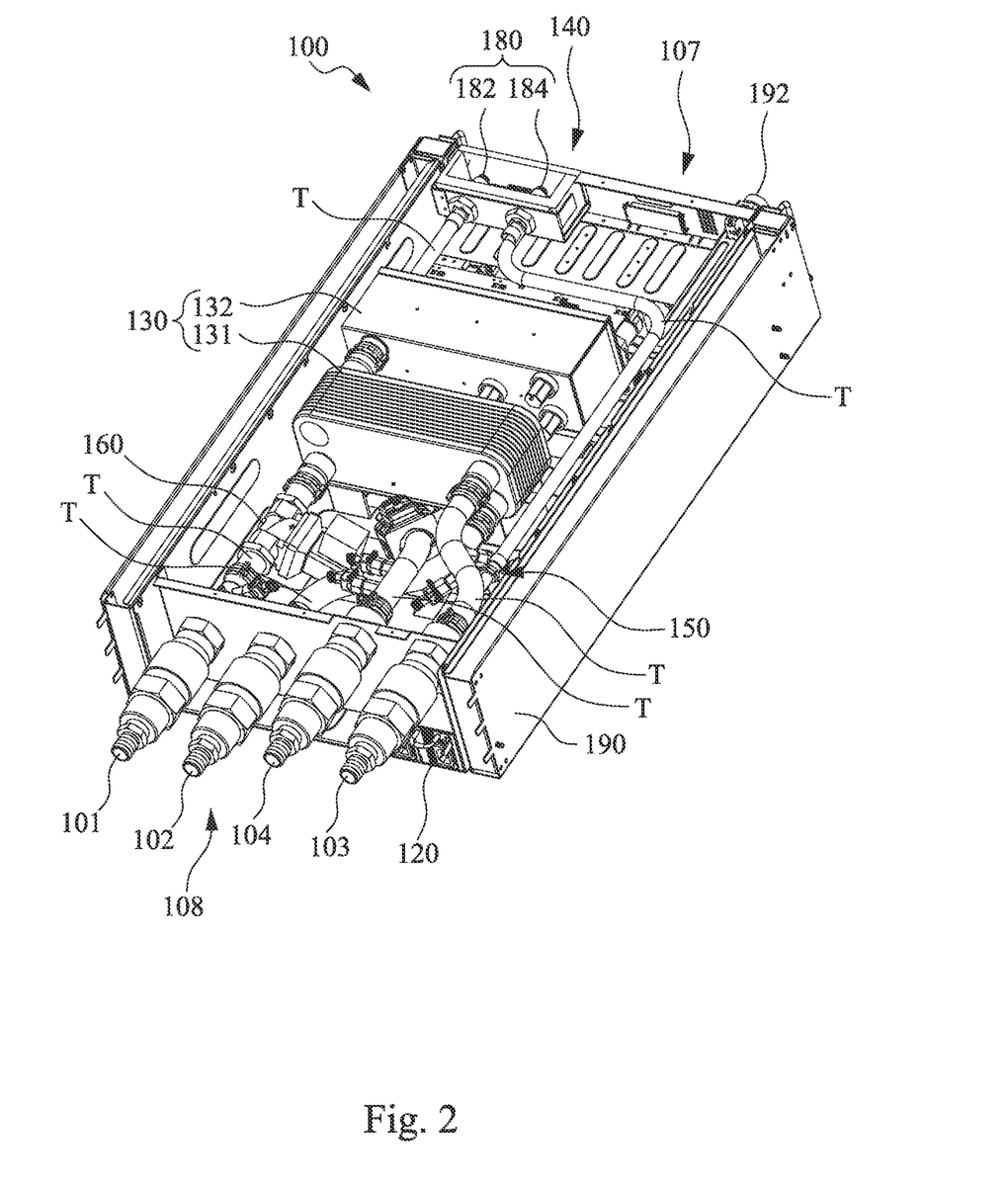
FIG. 2 illustrates another schematic perspective diagram of the coolant distribution unit of FIG. 1.
Figure 3:
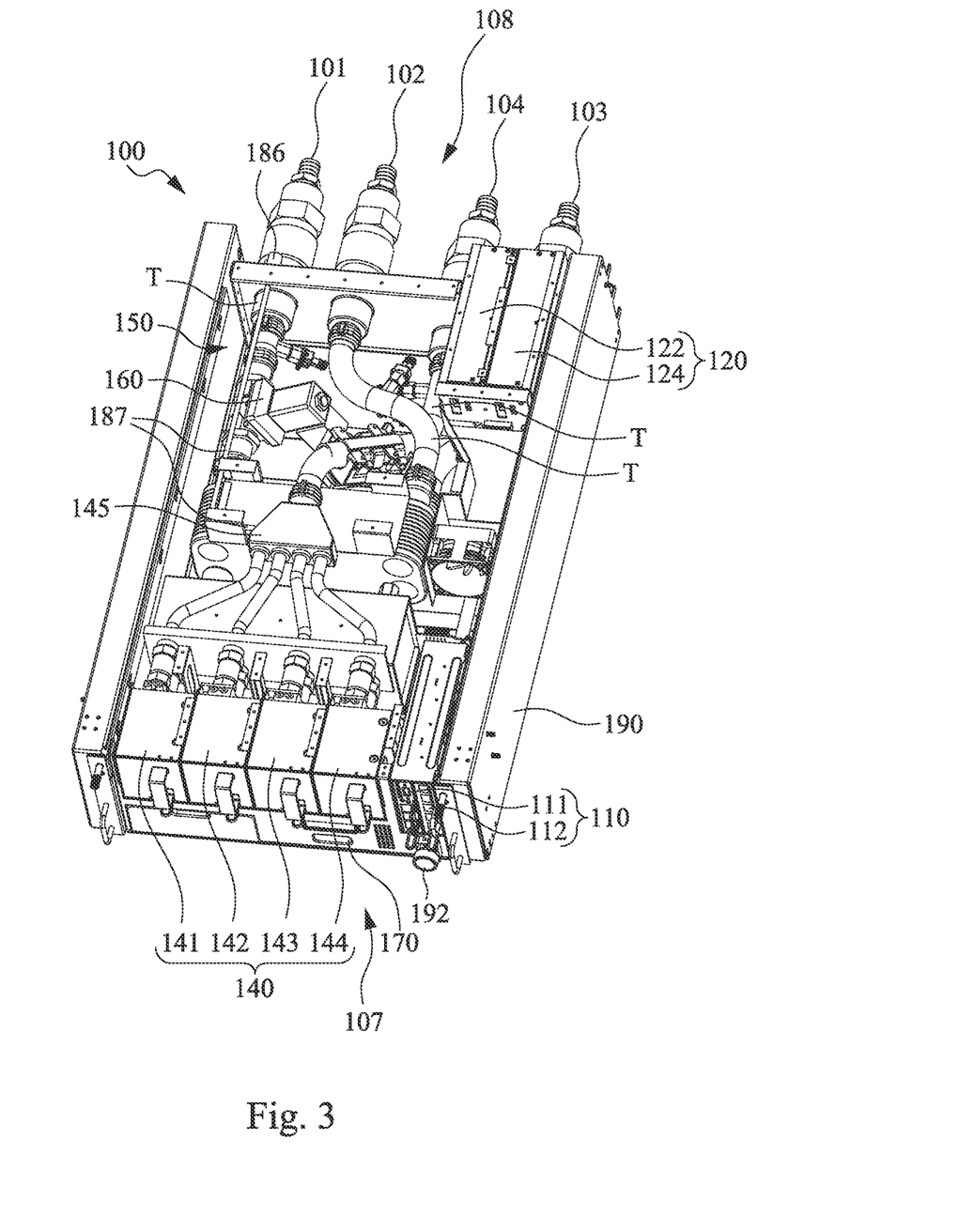
FIG. 3 illustrates further another schematic perspective diagram of the coolant distribution unit of FIG. 1.
Figure 4:
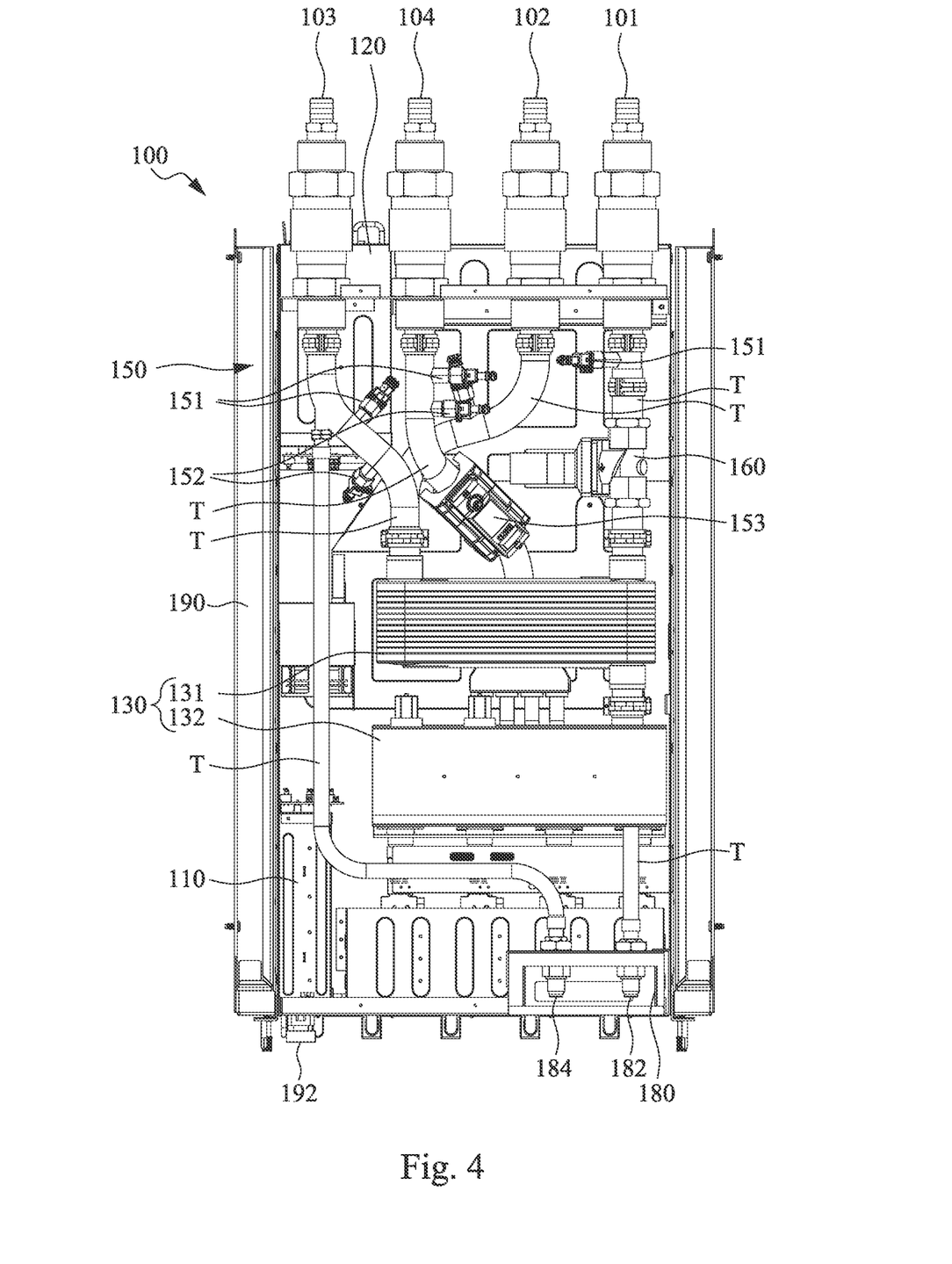
FIG. 4 illustrates a schematic top view of the coolant distribution unit of FIG. 1.
Figure 5:
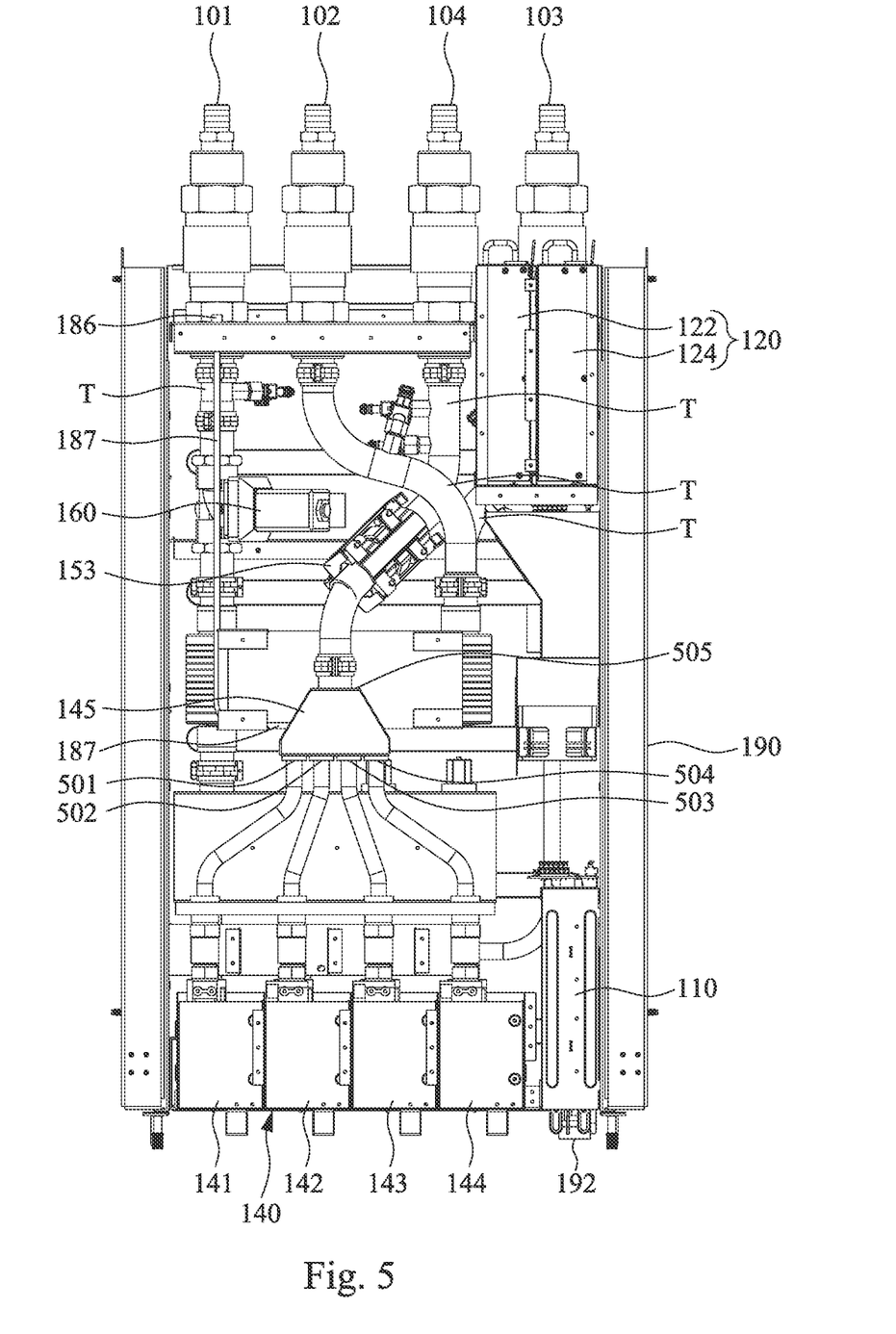
FIG. 5 illustrates a schematic bottom view of the coolant distribution unit of FIG. 1.
Figure 6:
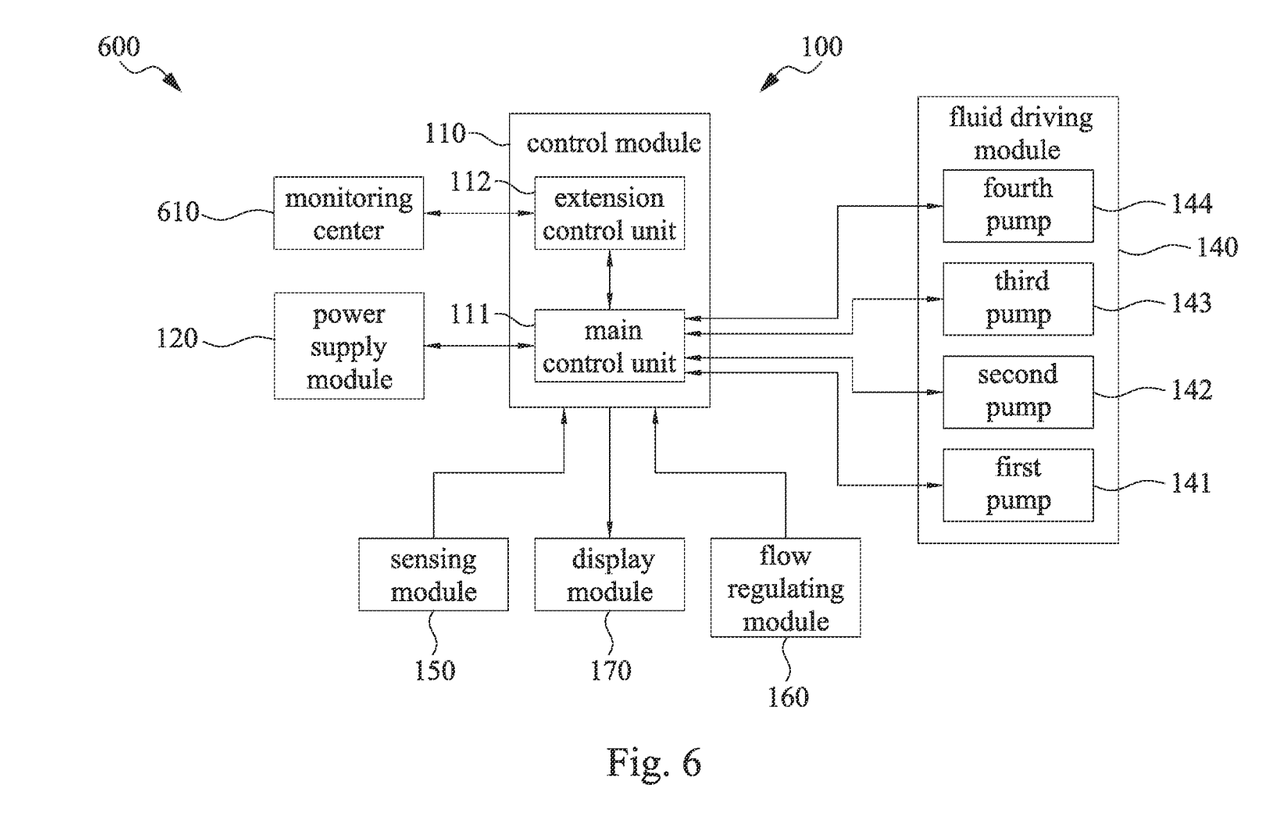
FIG. 6 illustrates a schematic functional block diagram of the coolant distribution unit of FIG. 1.
Figure 7:
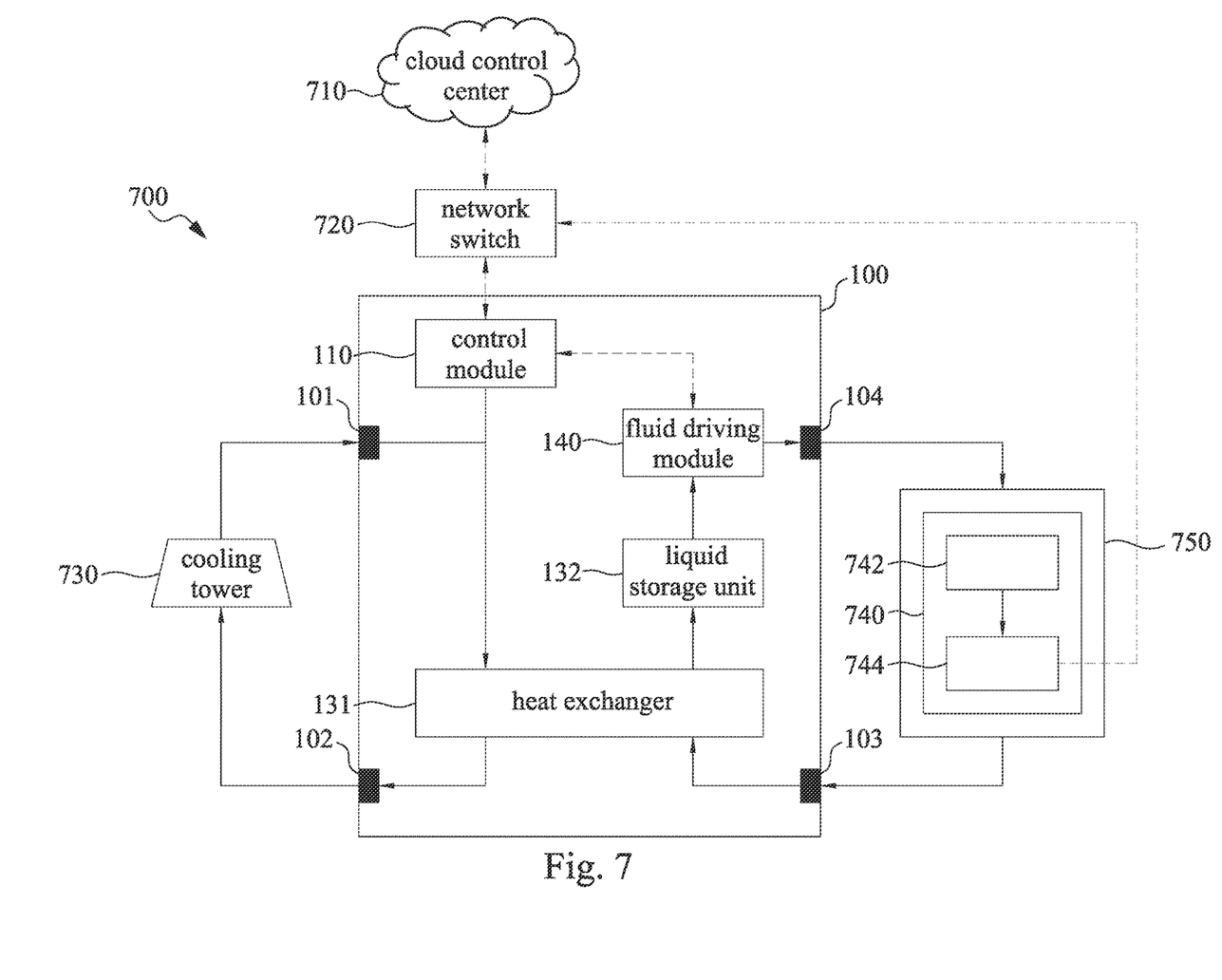
FIG. 7 illustrates a schematic diagram of the coolant distribution unit of FIG. 1 equipped in a rack cooling system.

FIG. 1 illustrates a perspective diagram showing a coolant distribution unit according to one embodiment of the present invention, FIG. 2 illustrates another perspective diagram thereof, FIG. 3 illustrates further another perspective diagram thereof, FIG. 4 illustrates a top view thereof, FIG. 5 illustrates a bottom view, FIG. 6 illustrates a functional block diagram thereof, and FIG. 7 illustrates a diagram of the coolant distribution unit of FIG. 1 equipped in a rack cooling system.

Referring to FIG. 1 to FIG. 3, the coolant distribution unit 100 includes a control module 110, a power supply module 120, a heat exchange module 130, a fluid driving module 140 and a casing 190. The control module 110, the power supply module 120, the heat exchange module 130 and the fluid driving module 140 are arranged in the casing 190. In some embodiments, the coolant distribution unit 100 further includes a first liquid inlet 101, a first liquid outlet 102, a second liquid inlet 103 and a second liquid outlet 104. The first liquid inlet 101, the first liquid outlet 102, the second liquid inlet 103 and the second liquid outlet 104 can allow a working fluid flowing therein and are connected to pipeline channels T in the casing 190.

The control module 110 electrically connects to the power supply module 120 and the fluid driving module 140, and the control module 110 can control the power supply module 120 to output a corresponding electrical power to the fluid driving module 140 according to the actual demand to operate the fluid driving module 140. The fluid driving module 140 can drive the working fluid in the heat exchange module 130 and the pipeline channels, and the heat exchange module 130 connects to the pipeline channels, the heat exchange module 130 communicates with the first liquid inlet 101, the first liquid outlet 102, the second liquid inlet 103 and the second liquid outlet 104 through the pipeline channels.

In some embodiments, the control module 110, the power supply module 120 and the fluid driving module 140 are detachably arranged in the casing 190. That is to say, the control module 110, the power supply module 120 and the fluid driving module 140 can be plugged into and unplugged from the casing 190 according to the actual demand. The user can respectively remove the control module 110, the power supply module 120 and the fluid driving module 140 from the casing 190 with the handles thereof.

In some embodiments, the power supply module 120 includes a first power supply module 122 and a second power supply module 124, and the user can respectively remove the first power supply module 122 and the second power supply module 124 by handles configured thereon from the casing 190.

As illustrated in FIG. 1 to FIG. 3, the heat exchange module 130 includes a heat exchanger 131 and a liquid storage unit 132, the fluid driving module 140 is disposed at one side of the liquid storage unit 132 of the heat exchange module 130, and the fluid driving module 140 is in fluid communication with the liquid storage unit 132.

Simultaneously referring to FIG. 7, when the coolant distribution unit 100 is equipped in a rack cooling system 700, the first liquid inlet 101 provides a low temperature working fluid, without waste heat, from the cooling tower 730 into the coolant distribution unit 100, the second liquid inlet 103 collects a high temperature working fluid passed through the server device 740, and the first liquid outlet 102 exhausts a high temperature working fluid with waste heat, that is, the low temperature working fluid enters into the coolant distribution unit 100 from the first liquid inlet 101 and passes through the heat exchanger 131 to carry out the waste heat. The second liquid outlet 104 exhausts a low temperature working fluid out of the coolant distribution unit 100 to transmit to a cold plate 750 which is in thermal contact with the server device 740, that is, the high temperature working fluid enters into the coolant distribution unit 100 from the second liquid inlet 103 and sequentially passes through the heat exchanger 131, the liquid storage unit 132 and the fluid driving module 140 to reduce the temperature thereof to form the low temperature working fluid and the lower temperature working fluid is transported to a cold plate 750. In another word, the path from the first liquid inlet 101 to the first liquid outlet 102 is an external circulation path of the coolant distribution unit 100, and the path from the second liquid inlet 103 to the second liquid outlet 104 is an internal circulation path of the coolant distribution unit 100. In addition, the so-called high temperature and low temperature are relative compared. For example, the high temperature working fluid has a higher temperature relative to the low temperature working fluid.

In some embodiments, the heat exchanger 131 is, for example, a plate heat exchanger to provide a heat exchange area for the low temperature working fluid entering from the first liquid inlet 101 and the high temperature working fluid entering from the second liquid inlet 103 so that the heat carried by the high temperature working fluid from the server device 740 is exchanged into the low temperature working fluid, but the present invention is not limited to this. In addition, the liquid storage unit 132 is used to temporarily store the working fluid passed through the heat exchanger 131 for buffering purposes, such as a water storage tank or a liquid storage tank with any geometric shape, and is made of the material not to interact with the working fluid, for example, stainless steel and so on. Moreover, the fluid driving module 140 is utilized to transport the low temperature working fluid from the liquid storage unit 132 through an integrated pipe 145 to the second liquid outlet 104 to provide the low temperature working fluid to the cold plate 750.

Simultaneously referring to FIG. 6, in some embodiments, the control module 110 includes a main control unit 111, a fluid driving module 140 includes a first pump 141, a second pump 142, a third pump 143 and a fourth pump 144. In some embodiments, the main control unit 111 of the control module 110 can adjust the operation performance of the fluid driving module 140 according to the operation status of the fluid driving module 140. For example, when the first pump 141, the second pump 142, the third pump 143 and the fourth pump 144 of the fluid driving module 140 are operating normally, the fluid driving module 140 outputs a first analog signal, for example, a rotational speed signal of the first pump 141, the second pump 142, the third pump 143 and the fourth pump 144, to the main control unit 111 of the control module 110, and an analog/digital converter built in the main control unit 111 converts the first analog signal into a digital signal while the main control unit 111 receiving the first analog signal. The main control unit 111 may determine that the operation status of the first pump 141, the second pump 142, the third pump 143 and the fourth pump 144 of the fluid driving module 140 is a normal status according to the digital signal, and then the main control unit 111 can further process the digital signal and a digital/analog converter built in the main control unit 111 can convert the digital signal into a second analog signal, for example, a pulse width modulation signal, and output the second analog signal to the fluid driving module 140 so as to control the first pump 141, the second pump 142, the third pump 143 and the fourth pump 144 of the fluid driving module 140 to maintain the current rotational speed.

When one of the first pump 141, the second pump 142, the third pump 143 and the fourth pump 144 of the fluid driving module 140 is operated abnormal, for example, the rotational speed of the first pump 141 is greater than 7000 rpm, that is, the first pump 141 is under an idle rotation, or the rotational speed is lower than 1000 rpm, that is, the pump is stopped or pulled out therefrom, the fluid driving module 140 can output a first analog signal to the main control unit 111 of the control module 110. The main control unit 111 receives the first analog signal and converts into a digital signal with the analog/digital converter built in the main control unit 111, the main control unit 111 can determine the operation status of the first pump 141 of the fluid driving module 140 is abnormal according to the digital signal, and the main control unit 111 can further process the digital signal to convert the digital signal into the second analog signal, i.e. a pulse width modulation signal, with the digital/analog converter built in the main control unit 111, and output to the second pump 142, the third pump 143 and the fourth pump 144 of the fluid driving module 140 to increase the rotational speed of the second pump 142, the third pump 143 and the fourth pump 144, for example, 10%-20% rotational speed increment or at full speed. At this time, the power supply module 120 can provide a corresponding electrical power to the second pump 142, the third pump 143 and the fourth pump 144 of the fluid driving module 140 to maintain a normal operation of the coolant distribution unit 100 so as to prevent the server device 740 connected to the coolant distribution unit 100 from overheating.

It is worth noting that, when the main control unit 111 fails or is removed from the casing 190 for maintenance, the fluid driving module 140 cannot receive the second analog signal from the main control unit 111. At this time, the power supply module 120 can directly output the electrical power to the fluid driving module 140 to operate the first pump 141, the second pump 142, the third pump 143 and the fourth pump 144 of the fluid driving module 140 at a full rotational speed although the main control unit 111 fails or is removed therefrom so that the coolant distribution unit 100 can be normally operated to prevent the fluid driving module 140 from shutting down and the server rack from overheating.

In some embodiments, the fluid driving module 140 includes four pumps, i.e. the first pump 141, the second pump 142, the third pump 143 and the fourth pump 144, is only an exemplary embodiment of the present invention. In another embodiment, the fluid driving module 140 may include more than four pumps and the main control unit 111 of the control module 110 can adjust the operation performance according to any one operation status of the pumps.

It is worth noting that, referring to FIG. 5, the integrated pipe 145 of the coolant distribution unit 100 is equipped between the first pump 141, the second pump 142, the third pump 143 and the fourth pump 144 of the fluid driving module 140 and the second liquid outlet 104. The integrated pipe 145 includes a plurality of working fluid inlets and an integrated outlet 505. The working fluid inlets include a first inlet 501, a second inlet 502, a third inlet 503, and a fourth inlet 504 respectively connected to the first pump 141, the second pump 142, the third pump 143 and the fourth pump 144 to collect the working fluid from the first pump 141, the second pump 142, the third pump 143 and the fourth pump 144 and then transport to the second liquid outlet 104 through the integrated outlet 505.

In some embodiments, a flow meter 153 is further equipped between the integrated outlet 505 and the second liquid outlet 104 to measure the flow rate of the working fluid delivered to the server device 740, and therefore the control module 110 can adjust the operation status of the fluid driving module 140 according to the flow rate information sensed by the flow meter 153 to control the flow rate of the working fluid. The coolant distribution unit 100 disclosed in the present invention may improve the flow passages of the liquid storage unit 132 and the integrated pipe 145, for example, the working fluid are collected by multiple inlets and guided to a single outlet, so as to effectively reduce the fluid resistance and makes the flow rate be increased more than 2 times to reach 60 LPM (liters per minute), and the maximum heat dissipation capacity can reach about 100 kW (kilowatts). In addition, due to the use of two independent circulation paths, an internal circulation path and an external circulation path, the worries of water leakage can be avoided, and the subsequent maintenance can be conveniently carried out.

In some embodiments, the coolant distribution unit 100 disclosed in the present invention is further designed with a coolant replacement module 180 including a coolant replacement inlet 182 and a coolant replacement outlet 184 both disposed on the front panel 107. In addition, the coolant replacement inlet 182 utilizes a pipeline channel T to connect to the liquid storage unit 132, and the coolant replacement outlet 184 utilizes a pipeline channel T to connect to the pipeline channel T of the second liquid inlet 103 so that a user can conveniently discharge the high temperature working fluid, from the server device 740 and received by the second liquid inlet 103, out of the internal circulation path through the coolant replacement outlet 184. In addition, a fresh working fluid can directly input and store in the liquid storage unit 132 through the coolant replacement inlet 182 to compensate the discharged working fluid, and then the working fluid at the end of service life may be directly replaced in front of the server rack without stopping the servers, so as to effectively and stably maintain the quality of the working fluid.

In addition, with a plurality of independent pumps having current overload protection unit, the overall flow can be effectively increased and the failure risk of the coolant distribution unit 100 can be effectively reduced.

In some embodiments, the coolant replacement module 180 further includes a coolant discharge port 186 disposed on the rear panel 108 and connect to the integrated pipe 145 through the coolant discharge pipe 187. In an embodiment, the coolant discharge pipe 187 is connected to a lower position of the integrated pipe 145 and the entire coolant distribution unit 100, and preferably the lowest point of the working fluid in the coolant distribution unit 100, so as to completely discharge the working fluid from the coolant distribution unit 100 to completely replace the working fluid.

In some embodiments, the coolant distribution unit 100 further includes an emergency switch 192 installed on the front panel 107 and electrically connected to the control module 110 to prevent the system from being unable to switch on or off when the network communication fails. In addition, the emergency switch 192 is arranged on the front panel 107 so that the user can conveniently turn on or turn off the coolant distribution unit 100 in front of the server rack.

In some embodiments, the pumps of the fluid driving module 140, i.e. the first pump 141, the second pump 142, the third pump 143 and the fourth pump 144, are connected to the pipeline channels with quick connectors. When the fluid driving module 140 is pulled out from the casing 190, the quick connectors can prevent the working fluid from leaking from the corresponding pipeline channel.

In some embodiments, the coolant distribution unit 100 may be operated with a cooling tower 730 disposed in an external circulation path to cool down the temperature of the high temperature working fluid having the waste heat exhausted from the first liquid outlet 102 to form the low temperature working fluid. In another embodiment, the cooling tower 730 can be replaced with any other cooling device, for example, a fan, a water-cooled radiator module or a water-cooled radiator module with a fan, to cool down the temperature of the high temperature working fluid having the waste heat exhausted from the first liquid outlet 102 to form the low temperature working fluid. For example, when the cooling tower 730 is replaced with a fan, the fan can blow the external circulation path to reduce the temperature of the working fluid, and when the cooling tower 730 is replaced with a water-cooled radiator module, the water-cooled radiator module can be connected to the external circulation path to reduce the temperature of the working fluid, and when the cooling tower 730 is replaced with a water-cooled radiator module with a fan, the water-cooled radiator module can be connected to the external circulation path and the fan can assist in blowing the water-cooled radiator module to reduce the temperature of the working fluid.

In some embodiments, as shown in FIG. 6, a cooling distribution system 600 includes the coolant distribution unit 100 and a monitoring center 610. The coolant distribution unit 100 further includes a sensing module 150, a flow regulating module 160 and a display module 170. The control module 110 further includes an extension control unit 112. The sensing module 150 can connect to the first liquid inlet 101, the first liquid outlet 102, the second liquid inlet 103, the second liquid outlet 104 or the pipeline channels to sense the sensing data of the working fluid in the first liquid inlet 101, the first liquid outlet 102, the second liquid inlet 103, the second liquid outlet 104 or the pipeline channels. In some embodiments, the sensing data is, for example, temperature data, flow rate data or pressure data of the working fluid. The flow regulating module 160 can connect to the pipeline channels to control the flow rate of the working fluid flowing in the pipeline channel. The main control unit 111 of the control module 110 electrically connects to the sensing module 150 and the flow regulating module 160, and the main control unit 111 may electrically connect to the monitoring center 610 through the extension control unit 112. The main control unit 111 receives the sensing data measured by the sensing module 150 and transmits the sensing data to the monitoring center 610 through the extension control unit 112. The monitoring center 610 sends control commands to the extension control unit 112 according to the sensing data and the control commands are transmitted to the main control unit 111, and the main control unit 111 controls the flow regulating module 160 according to the control command. The display module 170 is utilized to display, for example, the temperature data, the flow rate data or the pressure data measured by the sensing module 150. In some embodiments, the sensing module 150 includes a temperature sensor 151, a pressure sensor 152 or a flow meter 153. In some embodiments, the flow regulating module 160 is, for example, a proportional valve, and the display module 170 includes a liquid crystal display preferably disposed on the front panel 107 so as to be conveniently observed by the user. The sensing module 150, the flow regulating module 160 and the display module 170 can select suitable components according to the actual demand without departing from the spirit and the scope of the invention.

In some embodiments, the first liquid inlet 101, the first liquid outlet 102, the second liquid inlet 103 and the second liquid outlet 104 are equipped with quick connectors to quickly connect to the external pipeline channels of the coolant distribution unit 100 and prevent the working fluid from leaking from the pipeline channel.

In some embodiments, the main control unit 111 can control the operation performance of the fluid driving module 140 according to the operation status of the fluid driving module 140, and the main control unit 111 can also control the operation performance of the fluid driving module 140 according to the sensing data of the working fluid measured by the sensing module 150 located at the first liquid inlet 101, the first liquid outlet 102, the second liquid inlet 103, the second liquid outlet 104 or the pipeline channels. For example, when the temperature of the high temperature working fluid is higher than 80 degrees Celsius at the second liquid inlet 103, that is, the temperature of the working fluid absorbed the waste heat of a plurality of server devices 740 is higher than 80 degrees Celsius, the main control unit 111 controls the first pump 141, the second pump 142, the third pump 143 or the fourth pump 144 of the fluid driving module 140 to speed up the rotational speed thereof, for example, 10%-20% rotational speed increment. At this moment, the power supply module 120 provides a corresponding electrical power to the fluid driving module 140 to ensure no overheating problem occurred in the server devices 740 connected to the coolant distribution unit 100.

As shown in FIG. 7, in some embodiments, the rack cooling system 700 further includes a network switch 720 and a cloud control center 710, and the server device 740 includes a temperature sensor 742 and a control unit 744. The temperature sensor 742 can instantaneously detect the temperature of the server device 740 to get the temperature data, the control unit 744 receives the temperature data and transmits the same to the cloud control center 710 through the network switch 720 to store the temperature data measured by the temperature sensor 742 in the cloud control center 710, the control module 110 of the coolant distribution unit 100 can read the real-time temperature data of the server device 740 stored in the cloud control center 710 through the network switch 720, and the main control unit 111 of the control module 110 can determine whether an overheating problem occurred in the server device 740 according to the temperature data. If the main control unit 111 determines that the server device 740 is overheated, the main control unit 111 sends control commands to the fluid driving module 140 to increase the rotational speed of the first pump 141, the second pump 142, the third pump 143 or the fourth pump 144 of the fluid driving module 140 to prevent the server device 740 connected to the coolant distribution unit 100 from overheating.

Accordingly, the coolant distribution unit can effectively integrate the working liquid output by a plurality of pumps so as to increase the flow rate of the working liquid and improve the cooling capacity of the coolant distribution unit. In addition, the working fluid can be replaced with no downtime so as to maintain the quality of the working fluid and improve the working quality of the coolant distribution unit. Furthermore, the coolant distribution unit disclosed in the present invention is further designed with an emergency switch to prevent the system from being unable to turn on or off when the network communication fails so as to further improve the stability and safety of the coolant distribution unit in use.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A coolant distribution unit, comprising:
a casing;
a control module;
a power supply module electrically connected to the control module;
a heat exchange module;
an integrated pipe having a plurality of inlets and an outlet to collect a cooled working fluid and output the cooled working fluid through the outlet;
a fluid driving module electrically connected to the control module and the power supply module, and communicated with the heat exchange module, wherein the control module, the power supply module, the heat exchange module, the integrated pipe, and the fluid driving module are arranged in the casing;
a first liquid inlet;
a second liquid inlet;
a first liquid outlet;
a second liquid outlet, wherein a path from the first liquid inlet to the first liquid outlet is an external circulation path to connect a cooling device, and a path from the second liquid inlet to the second liquid outlet is an internal circulation path to connect a plurality of cold plates of a server device; and
a coolant replacement module connected between the second liquid inlet and the second liquid outlet, wherein the coolant replacement module comprises a coolant replacement outlet for discharging a high temperature working fluid from the internal circulation path and a coolant replacement inlet for providing a fresh working fluid into the internal circulation path, wherein the fluid driving module comprises a plurality of pumps to respectively connect to the inlets of the integrated pipe, wherein the coolant replacement inlet and the coolant replacement outlet are disposed on a front panel of the coolant distribution unit.

2. The coolant distribution unit of claim 1, wherein the outlet of the integrated pipe connects to the second liquid outlet to collect and output the cooled working fluid to the cold plates of the server device.

3. The coolant distribution unit of claim 1, wherein the coolant replacement inlet is in fluid communication with a liquid storage unit of the heat exchange module to add the fresh working fluid and the coolant replacement outlet is in fluid communication with the second liquid inlet to exhaust the high temperature working fluid.

4. The coolant distribution unit of claim 1, wherein the coolant replacement module further comprises:
a coolant discharge port disposed on a rear panel of the coolant distribution unit; and
a coolant discharge pipe connected between the coolant discharge port and the integrated pipe.

5. The coolant distribution unit of claim 4, wherein the coolant discharge pipe is connected to a lowest position of the cooled working fluid in the integrated pipe.

6. The coolant distribution unit of claim 1, further comprising an emergency switch disposed on the front panel of the coolant distribution unit.

7. The coolant distribution unit of claim 1, further comprising a display module disposed on the front panel of the coolant distribution unit.

8. The coolant distribution unit of claim 1, further comprising a sensing module and a flow regulating module, wherein the control module further comprises a main control unit and an extension control unit electrically connected to the main control unit, the sensing module detects sensing data of working fluid flowing in pipeline channels of the first liquid inlet, the second liquid inlet, the first liquid outlet and the second liquid outlet, and the flow regulating module controls flow rates of the working fluid flowing in the pipeline channels, wherein the main control unit of the control module electrically connects to the sensing module and the flow regulating module, and the main control unit electrically communicates with an external monitoring center through the extension control unit to send the sensing data to the external monitoring center through the extension control unit.

9. The coolant distribution unit of claim 8, wherein the control module reads real-time temperature data of the server device stored in a cloud control center through a network switch, and the main control unit of the control module determines whether the server device is overheated according to the real-time temperature data of the server device and controls the fluid driving module to adjust operation performances of the pumps of the fluid driving module.

* * * * *